United States Patent [19]

Cronin

[11] Patent Number: 4,957,044
[45] Date of Patent: Sep. 18, 1990

[54] DOUBLE SIDED SCREENER FOR PRINTED CIRCUIT BOARDS

[76] Inventor: John V. Cronin, 17282 Mt. Wynne Cir., Fountain Valley, Calif. 92708

[21] Appl. No.: 368,460

[22] Filed: Jun. 19, 1989

[51] Int. Cl.⁵ .................. B41F 15/08; B41F 17/00
[52] U.S. Cl. ........................ 101/35; 101/123; 101/126
[58] Field of Search ............... 101/126, 123, 122, 120, 101/35, 41; 118/213

[56] References Cited

U.S. PATENT DOCUMENTS

| | | |
|---|---|---|
| 1,840,073 | 1/1932 | Williams . |
| 1,901,473 | 3/1933 | Respess . |
| 2,039,909 | 5/1936 | Kem et al. . |
| 2,237,734 | 4/1941 | Grimsted . |
| 2,355,930 | 8/1944 | Thorne . |
| 2,581,775 | 1/1952 | Wade . |
| 2,704,510 | 3/1955 | Walsh, Jr. . |
| 2,739,530 | 3/1956 | McLaurin . |
| 2,751,842 | 6/1956 | McLaurin . |
| 2,810,340 | 10/1957 | Saunders . |
| 2,917,997 | 12/1959 | Black . |
| 2,963,964 | 12/1960 | Klump . |
| 2,975,705 | 3/1961 | Gilman . |
| 3,040,657 | 6/1962 | Ichinose . |
| 3,046,879 | 7/1962 | Ichinose . |
| 3,066,602 | 12/1962 | Ichinose . |
| 3,102,472 | 9/1963 | Kieckhefer . |
| 3,137,230 | 6/1964 | Ichinose . |
| 3,166,011 | 1/1965 | Landesman . |
| 3,398,680 | 8/1968 | Moskowitz . |
| 3,483,819 | 12/1969 | Hughes, Jr. . |
| 3,731,623 | 5/1973 | Bubley et al. . |
| 3,742,843 | 7/1973 | Gulikers ........................ 101/41 |
| 3,774,533 | 11/1973 | Ichinose . |
| 3,774,534 | 11/1973 | Ichinose . |
| 3,776,132 | 12/1973 | Rarey et al. . |
| 3,828,671 | 8/1974 | Fuchs . |
| 3,943,849 | 3/1976 | Vasilantone . |
| 3,955,501 | 5/1976 | Bubley et al. . |
| 4,005,651 | 2/1977 | Sigel et al. . |
| 4,063,503 | 12/1977 | Ichinose . |
| 4,063,531 | 12/1977 | Zitzow . |
| 4,079,674 | 3/1978 | Ichinose . |
| 4,084,505 | 4/1978 | Ichinose . |
| 4,084,506 | 4/1978 | Nakatani . |
| 4,094,242 | 6/1978 | Ichinose . |
| 4,226,182 | 10/1980 | Danielsen et al. . |
| 4,270,465 | 6/1981 | Lim . |
| 4,275,655 | 6/1981 | Artaud et al. . |
| 4,404,903 | 9/1983 | Cronin . |
| 4,419,613 | 12/1983 | Ichinose et al. . |
| 4,455,935 | 6/1984 | Manz et al. . |
| 4,682,271 | 7/1987 | Yamada . |

FOREIGN PATENT DOCUMENTS

| | | |
|---|---|---|
| 1107249 | 12/1955 | Fed. Rep. of Germany . |
| 1110179 | 7/1961 | Fed. Rep. of Germany . |
| 702298 | 3/1966 | Italy . |
| 347162 | 6/1960 | Switzerland . |
| 1115115 | 9/1984 | U.S.S.R. ........................ 101/126 |
| 743850 | 1/1953 | United Kingdom . |
| 2057357 | 7/1979 | United Kingdom . |

Primary Examiner—Clifford D. Crowder
Attorney, Agent, or Firm—Nilsson, Robbins, Dalgarn, Berliner, Carson & Wurst

[57] ABSTRACT

A vertical screening apparatus for simultaneously screening each side of a printed circuit board. The boards are transported from a feed assembly, into a position between two pivotally mounted screens where they are printed, then to an output assembly. Both sides of a board are printed simultaneously by means of flood blades and squeegees operating on the two screens to press them into contact with a board.

14 Claims, 12 Drawing Sheets

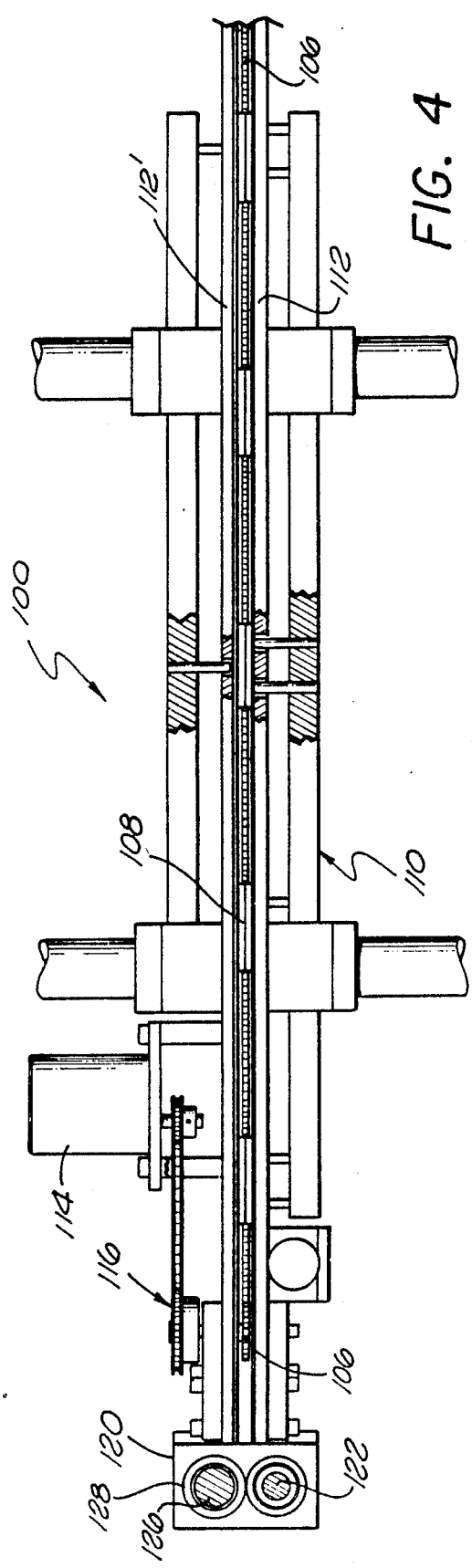
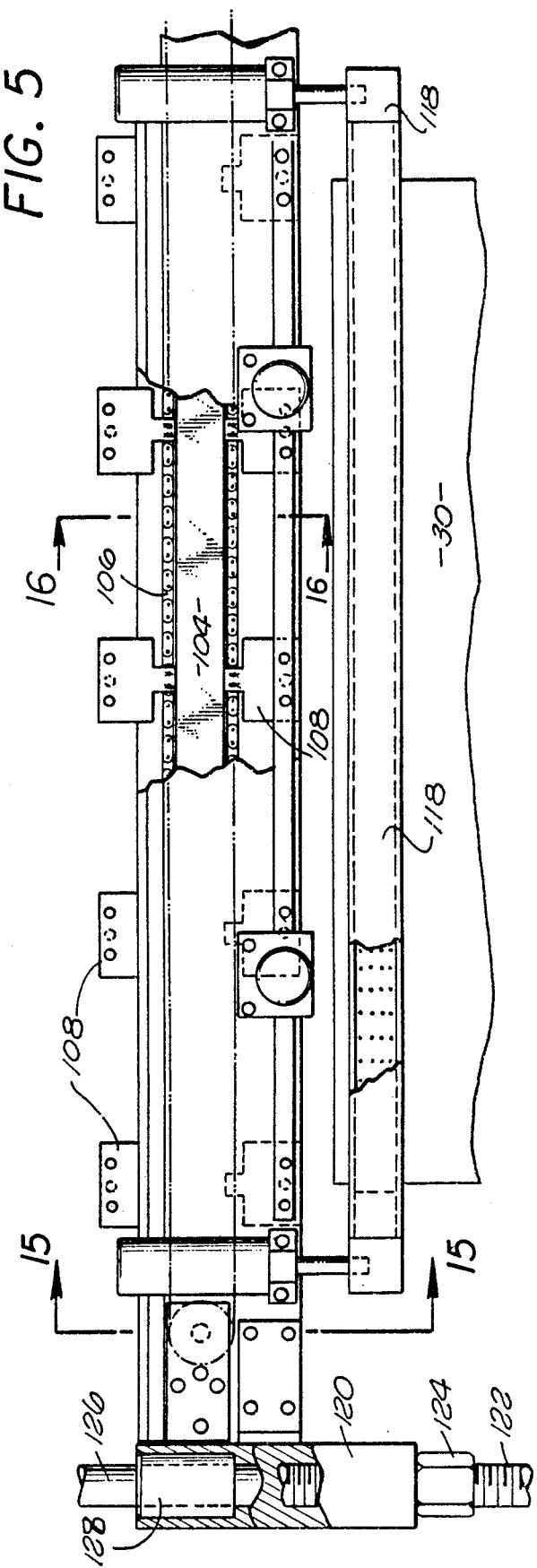

DOUBLE SIDED SCREENER FOR PRINTED CIRCUIT BOARDS

FIELD OF THE INVENTION

This invention relates generally to the field of print screening devices. More particularly the invention relates to the provision of a screen printing assembly capable of printing both sides of a circuit board simultaneously.

BACKGROUND AND PRIOR ART

Photopolymers are starting to find widespread application in the preparation of printed circuit boards and other electronic devices. These materials are applied to copper-laden circuit boards by screen printing and/or stenciling techniques which are well known in the art.

Applicant's prior U.S. Pat. No. 4,409,903 describes a semi-automatic device that uses a horizontal print stroke to print a photoimagable ink on one side of a board. To print both sides of a circuit board, the screened coating must first be cured by passing the board through an oven, then the board is rescreened on the reverse side. Many individual handling steps are required: screen the first side, hold, bake, cool, hold, screen the second side, hold, bake, cool, hold, and then expose. Accurate baking of photopolymer ink is critical to the success of the process. If the boards are screened in two separate operations, they must be baked after each screening, with the result that one side will be baked twice. The latitude of many photopolymers useful as inks is limited so that one side must be slightly under-cured while the other is slightly over-cured. In addition, copper on the uncoated side of the board is unprotected and tends to oxidize during the first baking step. Another drawback is that holes in circuit boards readily clog with ink, requiring much harsher developing methods to clear the hole. Finally, since the first inked side is slightly under-cured, and may be soft and tacky when the second side is inked, the surface of the first inked side can be susceptible to contamination and easily damaged.

Conventional screening mechanisms not only require multiple handling steps to screen both sides of the circuit board, but the sequence of steps severely limits the feasibility and extent of automation.

U.S. Pat. No. 4,275,655 issued to Gerrard P. Artaud et al describes a device for simultaneously printing both sides of a target. More particularly, the '655 patent describes a device for acid resist printing an identical image on both sides of a continuous metallic web that is drawn through the printing zone under tension. Opposing squeegees are mounted on a unitary carriage to ensure mirror image printing. There is little disclosure in this patent that is useful in developing apparatus to facilitate the manipulation of circuit boards and chases in various stages of closure, flooding, printing and opening.

BRIEF SUMMARY OF THE INVENTION

The foregoing disadvantages of the art are overcome by the present invention which provides a unique mechanism for simultaneously screening both sides of a circuit board. In particular, a double sided vertical screening apparatus is provided that includes a feed platen assembly for driving vertically mounted printed circuit boards forward to a board transport mechanism which sequentially transports the boards into a print zone within a vertical double sided screen print assembly. The board transport mechanism also removes each board from the print zone after printing, and transports it to an output platen assembly which moves the boards to a wait area for subsequent placement in a curing oven.

The board transport mechanism comprises a vacuum clamp, and a series of board clamps which are attached to a chain rotatably mounted on a horizontal transport bar. The board transport mechanism uses the vacuum clamp to lift a printed board from the platen feed assembly, causing the edge of the board to be engaged by the board clamps. It then feeds the board to the screening zone of a screen print assembly where photoimagable material is applied.

The screen print assembly comprises two chases, ink wells, and a flood blade and squeegee vertical drive system. The chases are vertically mounted in an opposing spatial relationship to facilitate the simultaneous application of photopolymer deposits on each side of the target circuit board. As is well known in the art, pliable penetrable screening membranes, commonly referred to as screens, are mounted within each chase. Each chase is pivotally mounted on its base to facilitate separation of the screening membranes from the target circuit boards following the print stroke.

The squeegee vertical drive system is formed from opposing flood blades and print squeegees conjunctively mounted on horizontal bars which reciprocate through vertical planes on opposite sides of the vertical chases. The horizontal bars are each slidably connected to guide bars which are mounted on the screener base table and are driven by ball screw systems. A single chain drives all four screw systems.

Photopolymer materials are applied to target circuit boards via a print stroke that is defined by a vertical rise of the squeegee vertical drive system during which flood blades lift ink from a well at the bottom of the print zone to flood the screening membrane, followed by the descent of the squeegee vertical drive system where print squeegees displace the inked membranes of each chase and cause them to contact each side of the circuit board for simultaneous printing. Stops are used, preferably on one squeegee assembly only so that the opposing pressures serve to achieve and maintain parallel alignment of the squeegees.

The vertical drive system is raised and lowered by a screw mechanism that is driven by a unitary chain from twin d.c. motors. One motor drives the system up and down. The other motor serves as a counterbalance. As the print squeegees descend along each of the print screens, an air actuated cylinder at the top of the chases causes the opposing chases to pivot about their bases thereby incrementally separating the print screens to allow the boards to be printed with a lower off contact. As a result of this feature, fewer bubbles are deposited in the ink and a smoother ink deposit is obtained following cure.

Inasmuch as inking is accomplished with opposing flood blades and the print stroke is completed with opposing squeegees acting simultaneously on the circuit board, excess ink does not accumulate in the component holes, and does not have to be developed out of the holes during final processing. To prevent photopolymer ink buildup on the screens at the hole locations, means are provided to shift, i.e., jog the screens approximately one quarter of an inch after each impression. This moves the ink deposit that would have been over a hole to a new location and presents clean screen regions to most of the new holes.

At the end of the print stroke, with the chases in a fully opened position, the board transport assembly moves the printed board from the print zone to an output platen for movement to a waiting area for placement in an oven for subsequent curing. A more reproducible product is obtained than with the usual horizontal screen mechanism because both sides of the board are subjected to the identical cure cycle.

As each printed board is removed from the printing zone, an unprinted board is transported from the feed platen to take its place. The system is always full, and it runs continuously with minimal manual operator interfacing.

BRIEF DESCRIPTION OF THE DRAWINGS

FIG. 4 is a partial plan view of the invention showing the board transport mechanism and its support mechanism.

FIG. 5 is a partial elevation view of the invention shown in FIG. 4.

DETAILED DESCRIPTION OF THE INVENTION

Figure 1:
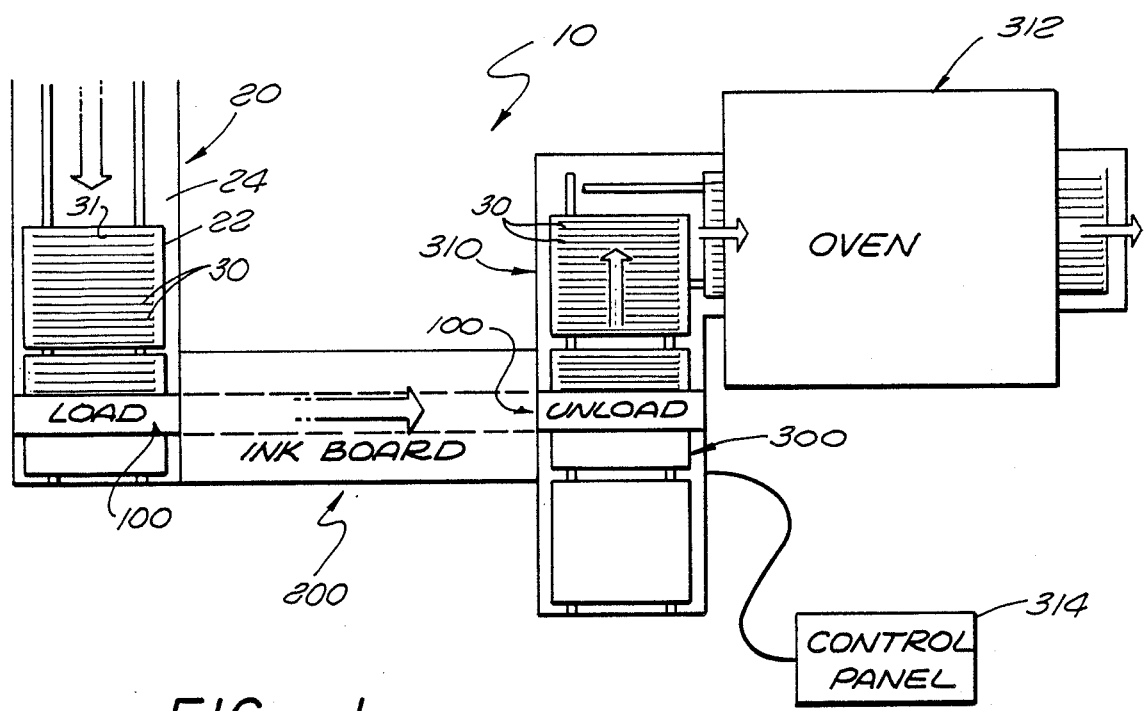
FIG. 1 is a schematic plan view of a double sided screening apparatus that has been constructed in accordance with the present invention.

Referring to FIG. 1 a schematic top view of an automated screening apparatus 10 is shown. The apparatus has a feed mechanism 20, that sequentially drives printed circuit boards 30 to contact a board transport mechanism 100 which removes the boards 30 from the mechanism 20 and feeds them into the print zone of a screen print assembly 200. The boards are held in place by the transport mechanism 100, printed in the screen print assembly 200, and subsequently transported by the board transport mechanism 100 to an output platen 300 which removes them from the screening area of the apparatus to a wait area 310 for subsequent placement in a curing oven 312. The apparatus is computer driven to enable any combination of flood and print strokes to be programmed in at the control panel 314.

The feed mechanism 20 has a slotted platen 22 slidably connected to a table 24 to facilitate movement of the platen 22 as needed to advance printed circuit boards 30 that have been loaded, on their edges, into slots 31. The slotted platen 22 is chain driven by a d.c. motor (not shown) mounted under the table 24.

Figure 2:
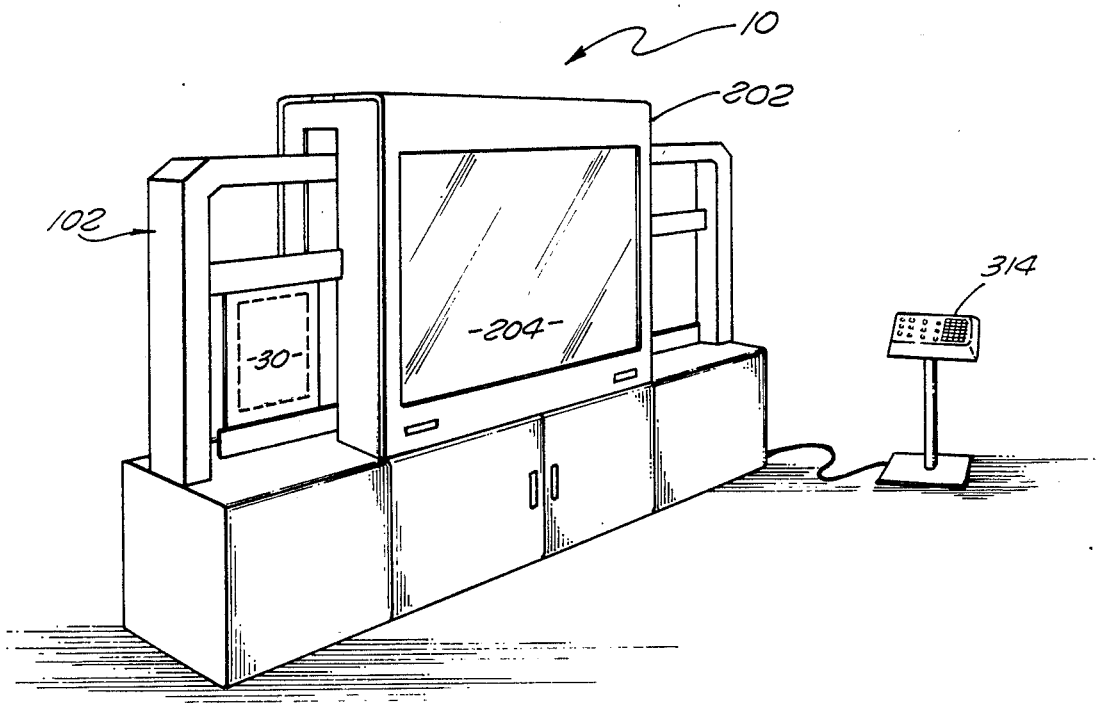
FIG. 2 is a pictorial view of the invention and associated enclosure less the feed and output platens.

A pictorial view of one embodiment of the screening apparatus 10 less the feed platen and output platen is shown in FIG. 2. Here, the screen print assembly is in a protective enclosure 202, which serves to facilitate atmospheric control over print conditions and minimize contamination of the photoimagable materials. The enclosure 202 is vented, the vents being regulated by a servo motor to maintain a slight positive pressure, e.g., about 1" water. An operator may monitor the print stroke via a viewing window 204, provided on each side of the enclosure 202.

Figure 3:
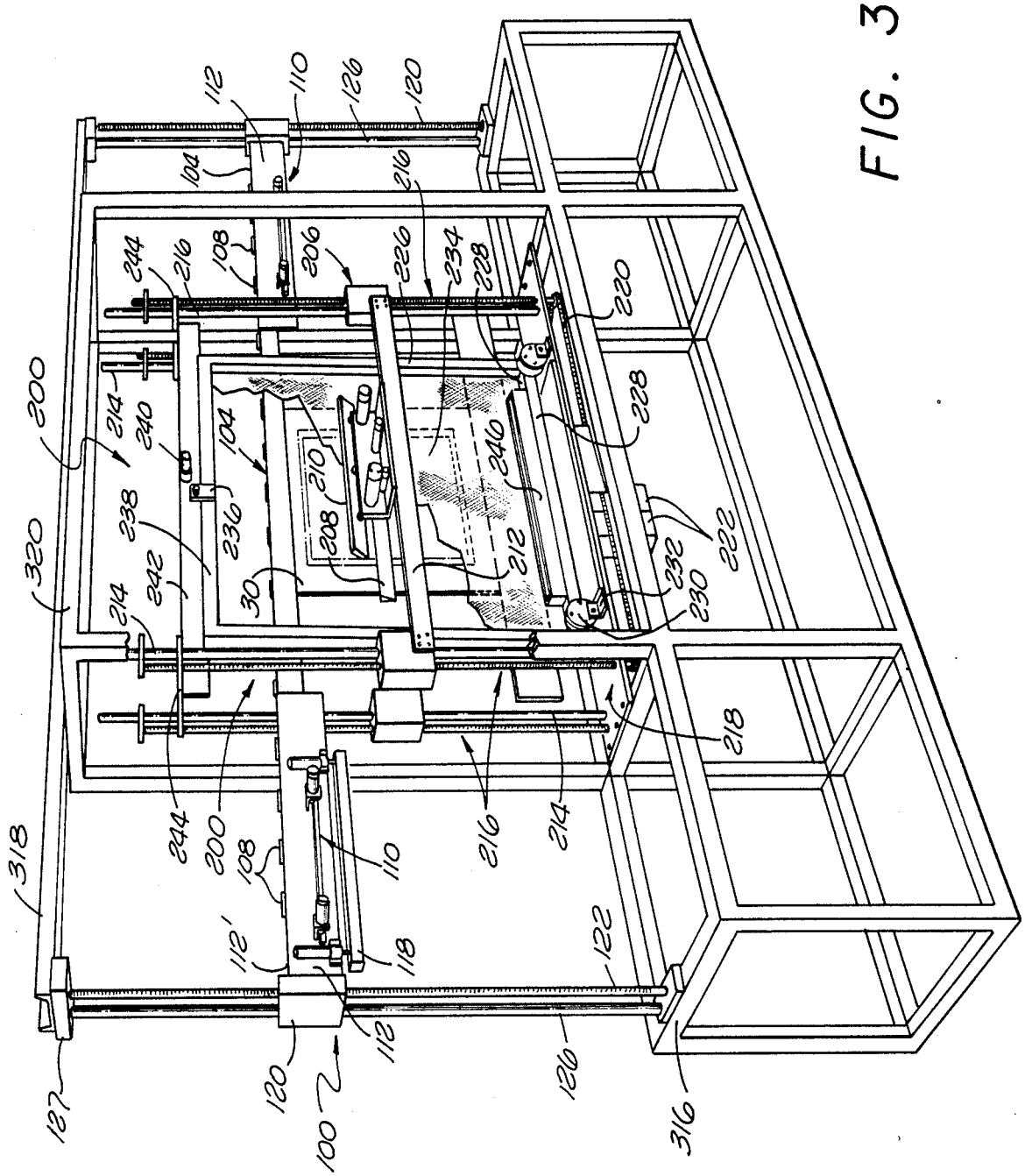
FIG. 3 is a perspective view of the invention less the feed and output platens.

FIG. 3 shows a perspective view of the invention. The board transport mechanism 100 extends across the entire length of the screen print assembly 200. Circuit boards 30 transported thereby are loaded, simultaneously printed on each side thereof by a squeegee vertical drive system 206, and unloaded without being touched by human hands.

Referring additionally to FIGS. 4 and 5, the board transport mechanism 100 is further defined by a horizontal transport bar 104 that runs through the length of the transport mechanism and contains a clamp drive chain 106 rotatably attached on each end thereof. The clamp drive chain 106 revolves about the periphery of the transport bar 104 in a vertical plane; thereby providing a rotary drive mechanism for board clamps 108 that are attached thereto.

The board clamps are made of tempered steel and are normally closed. Therefore a pin bar mechanism 110, that is attached to front and back mounting plates 112 and 112' at each end of the transport bar 104, is provided to simultaneously open at least two of the clamps. A more detailed description of the board clamps 108, and the pin bar mechanism, will be provided below with reference to FIGS. 15 through 17.

Figure 6:
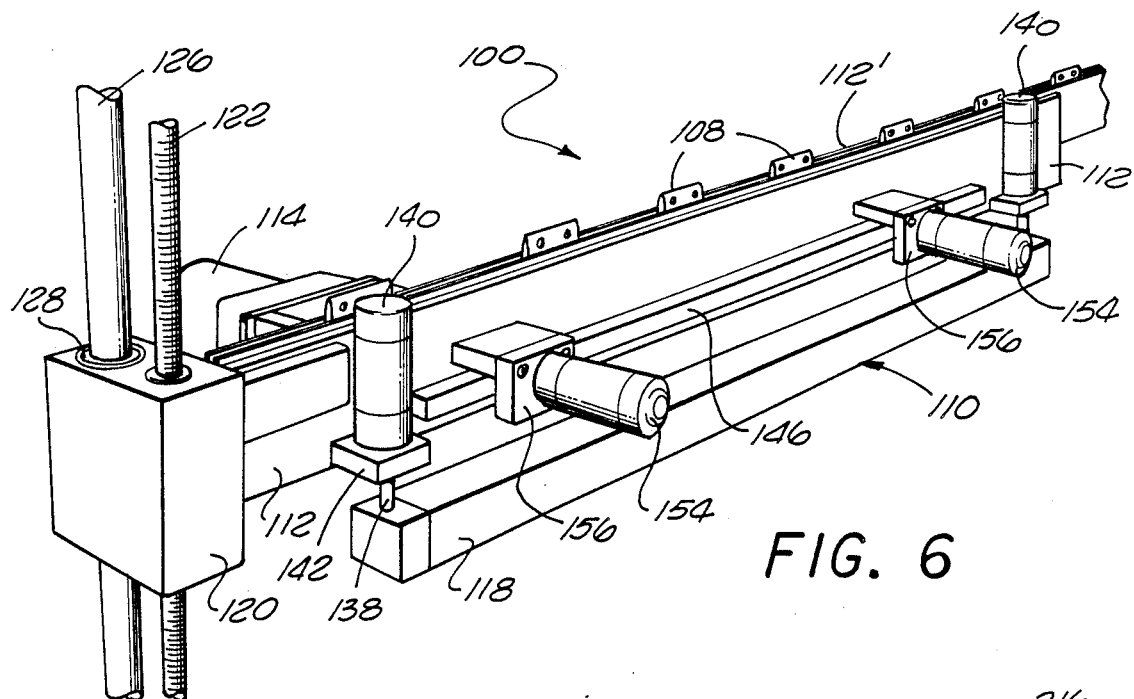
FIG. 6 is a partial perspective view of the invention showing the attachment of the board transport mechanism, the vacuum clamp and the screw drive unit.

At the loading end of the transport mechanism 100, the mounting plates 112 and 112' serve as points of attachment for a motor 114 and sprocket assembly 116 that drives the clamp drive chain 106, and for a vacuum clamp 118 that lifts boards 30 from the feed mechanism 20 to engage the board clamps 108. The mounting plates 112 are secured to a housing block 120 that is slidably connected to the assembly frame base 316. The entire transport mechanism 100 is supported on a screw 122 and nut 124 at each end of the unit and is guided by rods 126 and linear bearings 127. FIG. 6 shows a perspective view of this aspect of the invention.

A screw 122 and rod 126 are mounted, at the lower end of the rod, adjacent each side of the longitudinal centerline of the assembly frame base 316, and they are stabilized at the top ends thereof by support bearings 130 which are connected to a longitudinal extension 318 from the assembly frame top 320.

Figure 7:
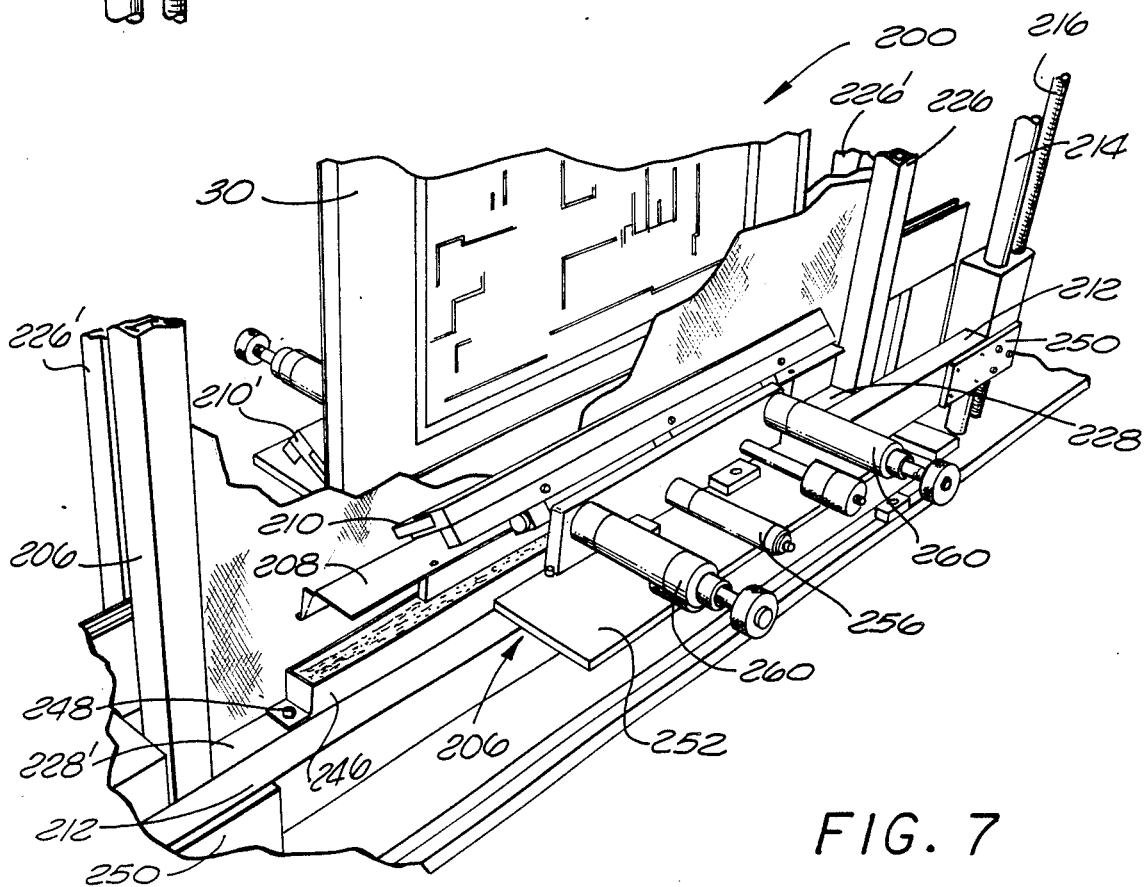
FIG. 7 is a partial perspective of the invention showing a portion of the screen print assembly.
Figure 9:
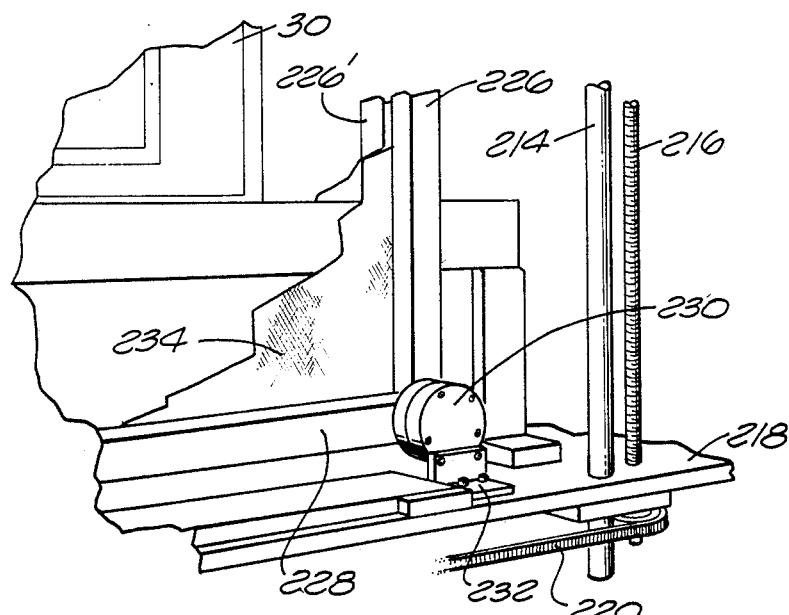
FIG. 9 is a partial perspective of the invention showing the chase mounting assembly and board guide.
Figure 8:
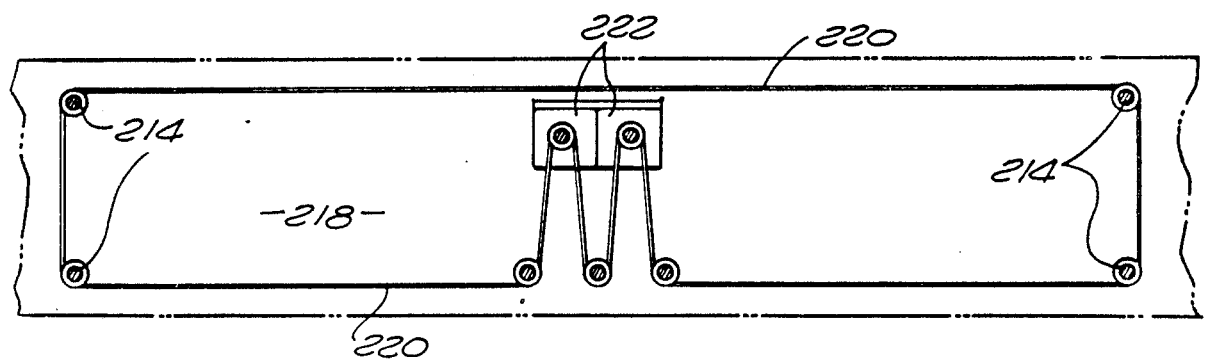
FIG. 8 is a plan view from the bottom of the assembly base plate showing the d.c. motors, chain, and screws.

FIGS. 3 and 7 provide an overall view of the screen print assembly 200. A squeegee vertical drive system 206 is formed by conjunctively mounting opposing flood blades 208, 208' and opposing print squeegee 210, 210' onto cross members 212, 212'. The cross members 212, 212' are slidably attached, as hereinafter described, to guide bars 214, and they are screw driven in a vertical plane by screw systems 216 which are mounted on each of the four corners of a system base plate 218. The screw systems 216 are driven by a single chain 220 and two d.c. motors 222 that are mounted on the bottom side of the base plate 218 as shown in FIG. 8. A more detailed description of the squeegee vertical drive assembly will be provided below with reference to FIGS. 11, and 18 through 21.

Figure 10:
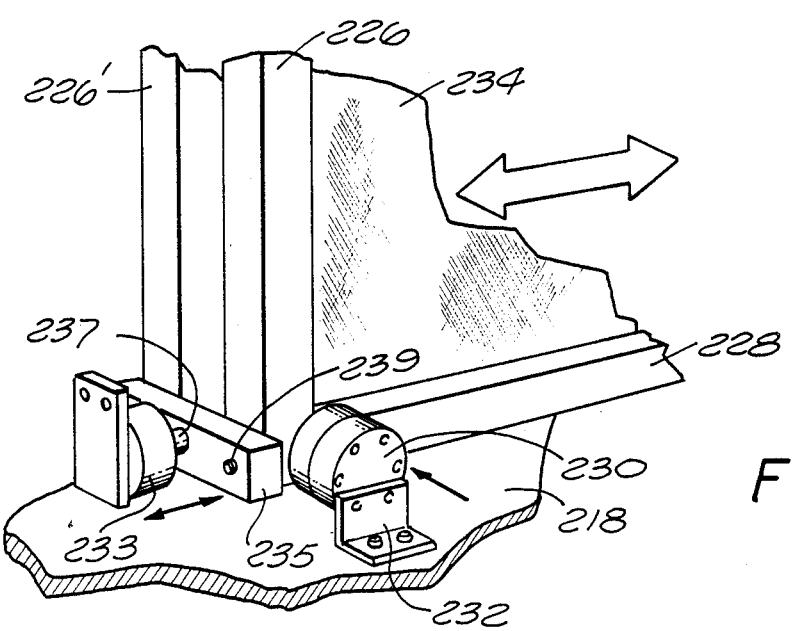
FIG. 10 is a partial perspective of the invention which shows how cylinder clamps are employed to jog the chases.
Figure 18:
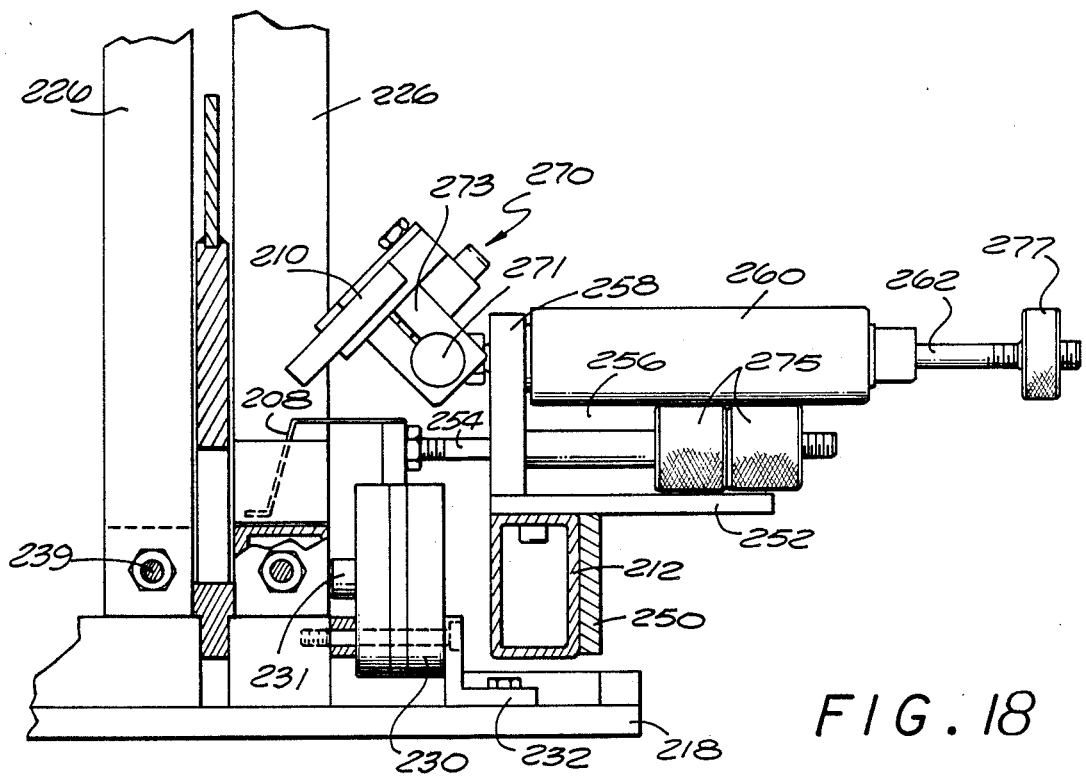
FIG. 18 is a partial cross sectional view of the invention showing one side of the vertical drive system.
Figure 19:
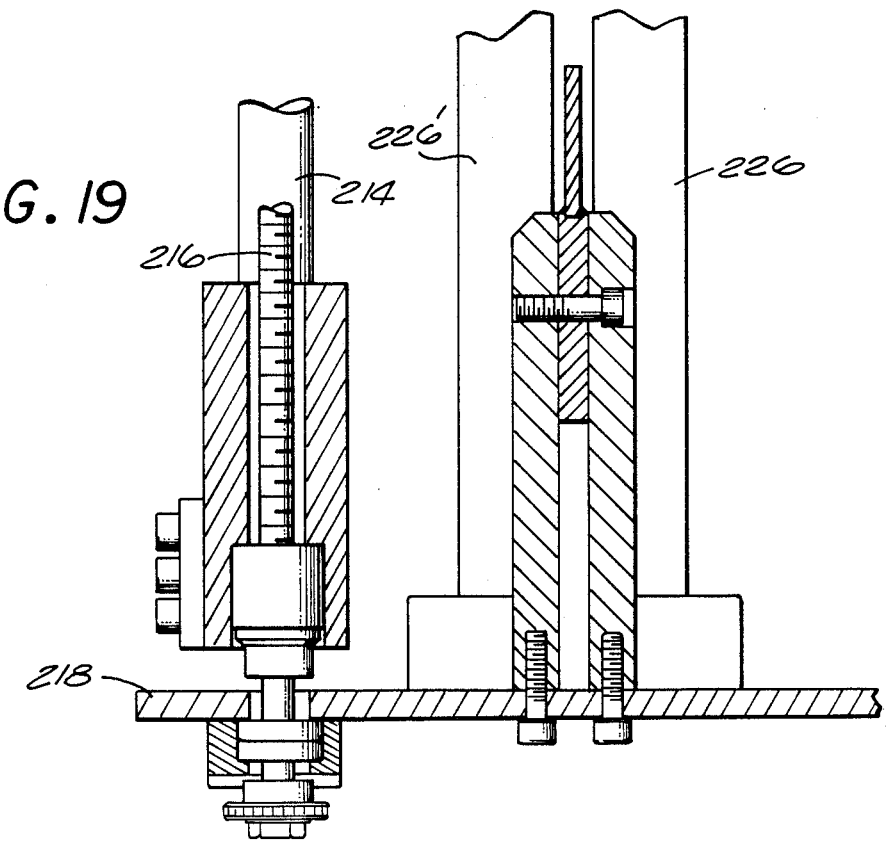
FIG. 19 is a partial cross sectional view of the invention showing the ball screw drive mechanism, and the board support mechanism.

Referring particularly to FIGS. 7 and 9 through 11, disposed between the opposing flood blades and opposing squeegees (see FIG. 7) are two vertical chases 226, 226' that are pivotally mounted about their bases 228, 228' with a series of air driven cylinder clamps 230 affixed to the system base plate 218 via brackets 232. Referring to FIG. 18, a piston 231 is pneumatically extendable from the cylinder clamp 230 to impinge against the surface of the associated chase. The cylinder clamps 230 thus facilitate rapid removal and replacement of the chases. In addition, as shown in FIG. 10, an air driven cylinder clamp 233 is located on each end of the chase assembly, each affixed by a bracket to frame member (not shown). Each end clamp 233 is provided with a push bar 235 fixed to the clamp piston 237. Each end of the push bar 235 is formed with a hole which is fitted with an adjustment screw 239, the inner protruding end of which impinges on the associated chase frame. The push bar 235 thus is very accurately adjustable to provide a desired degree of lateral movement to jog the chases approximately 0.25 inches along the X axis. A similar arrangement of cylinder clamps can be used beneath and on top of the chase assembly if it is desired to jog the chases along the Z axis (not shown). Jogging of the chases, after each impression has been made, helps to keep ink out of the circuit board holes.

Figure 12:
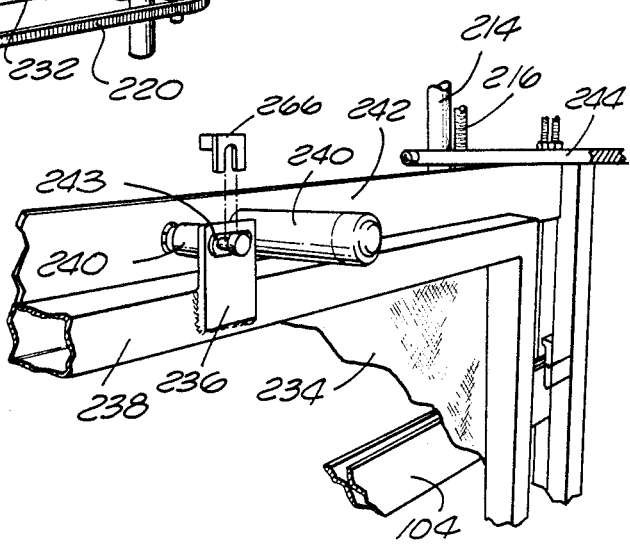
FIG. 12 is a partial perspective of the invention showing the chase pivot drive mechanism.
Figure 13:
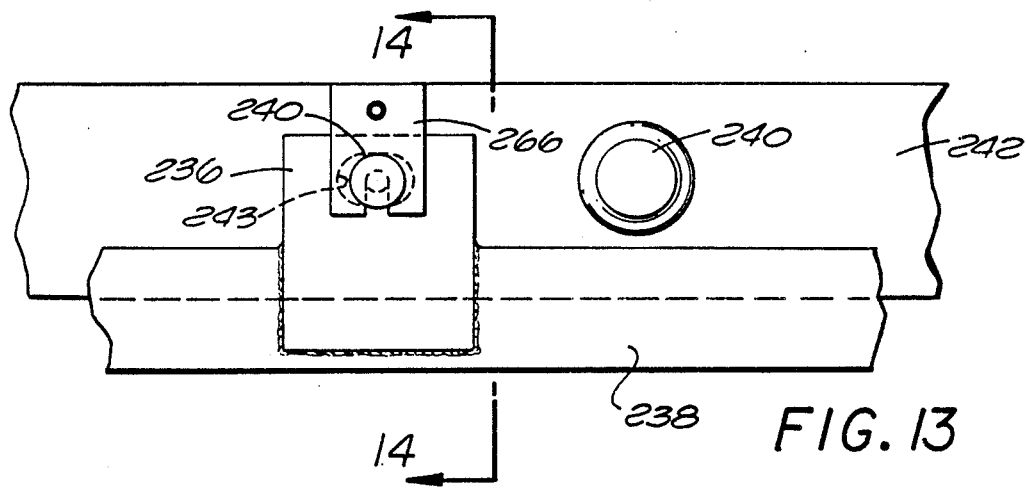
FIG. 13 is a partial elevation view of the invention showing the chase pivot drive flange and stabilization bar.
Figure 14:
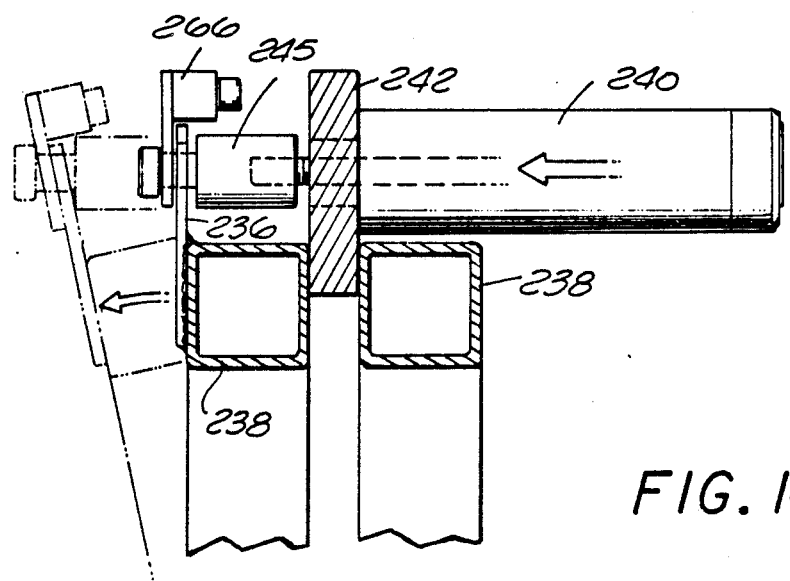
FIG. 14 is a cross section of the invention taken along lines A—A of FIG. 13.

As is known in the art, a pliable print screen 234 is disposed within each chase 226. In order to provide stability for the pivotally mounted chases, and to reduce off contact during the print stroke by pivotally driving the chase, each chase 226 is provided with a flange 236 near the center of the chase top 238, as shown more particularly in FIG. 12, which is adapted to be connected to, and form a leverage point for, a chase-pivot drive 240 that is mounted near the center of the print assembly top support member 242. The chases 226, 226' are rotatably attached to the shafts of the opposing cylinders by removable clamps 266. The clamps 266 and the cylinder clamps 230 constitute the sole securement means for the chases, allowing the chases to be easily removed. The flange 236 is slotted, at 243, to facilitate the jogging step referred to above. Referring also to FIGS. 13 and 14, the top support member 242 is a flat bar which extends along the longitudinal center line of the screen print assembly 200 and is tied to adjustable cross ties 244 at each end thereof.

Figure 20:
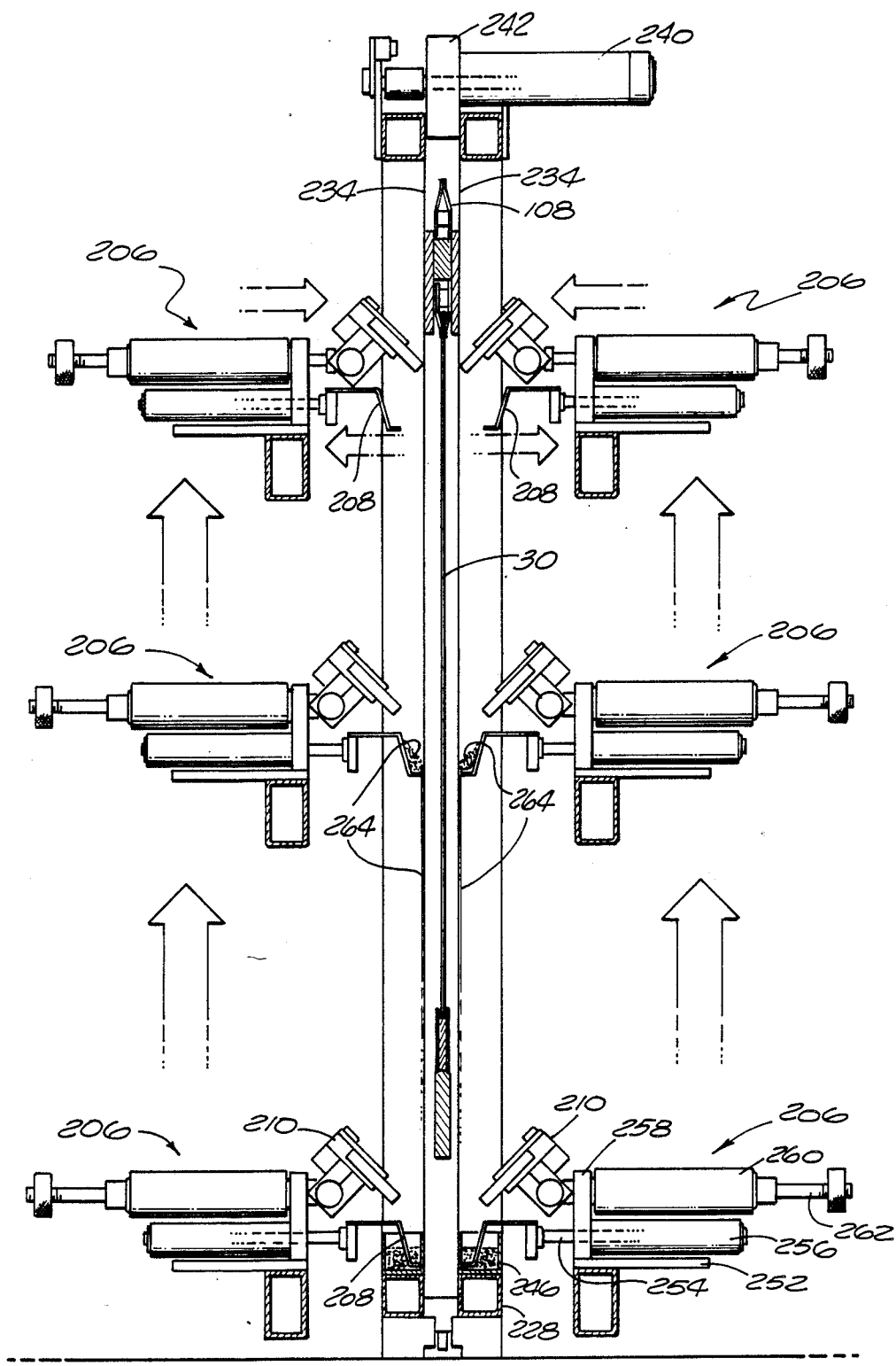
FIG. 20 is schematic cross section of the invention showing the flood stroke.

Of critical importance to the printing sequence is the transfer of photoimagable materials, commonly referred to as "ink", to the screen. Referring to FIGS. 7 and 20, to ensure the success of this phase of the process, an ink reservoir 246 is provided along the top surface 228a of each chase base 228 so as to be positioned proximate to the screen 234. The ink reservoir 246 is removably connected to the chase base with suitable attachment means, such as allen screws 248. This facilitates cleaning and enables the ink to be more easily saved after the chase is removed.

Figure 15:
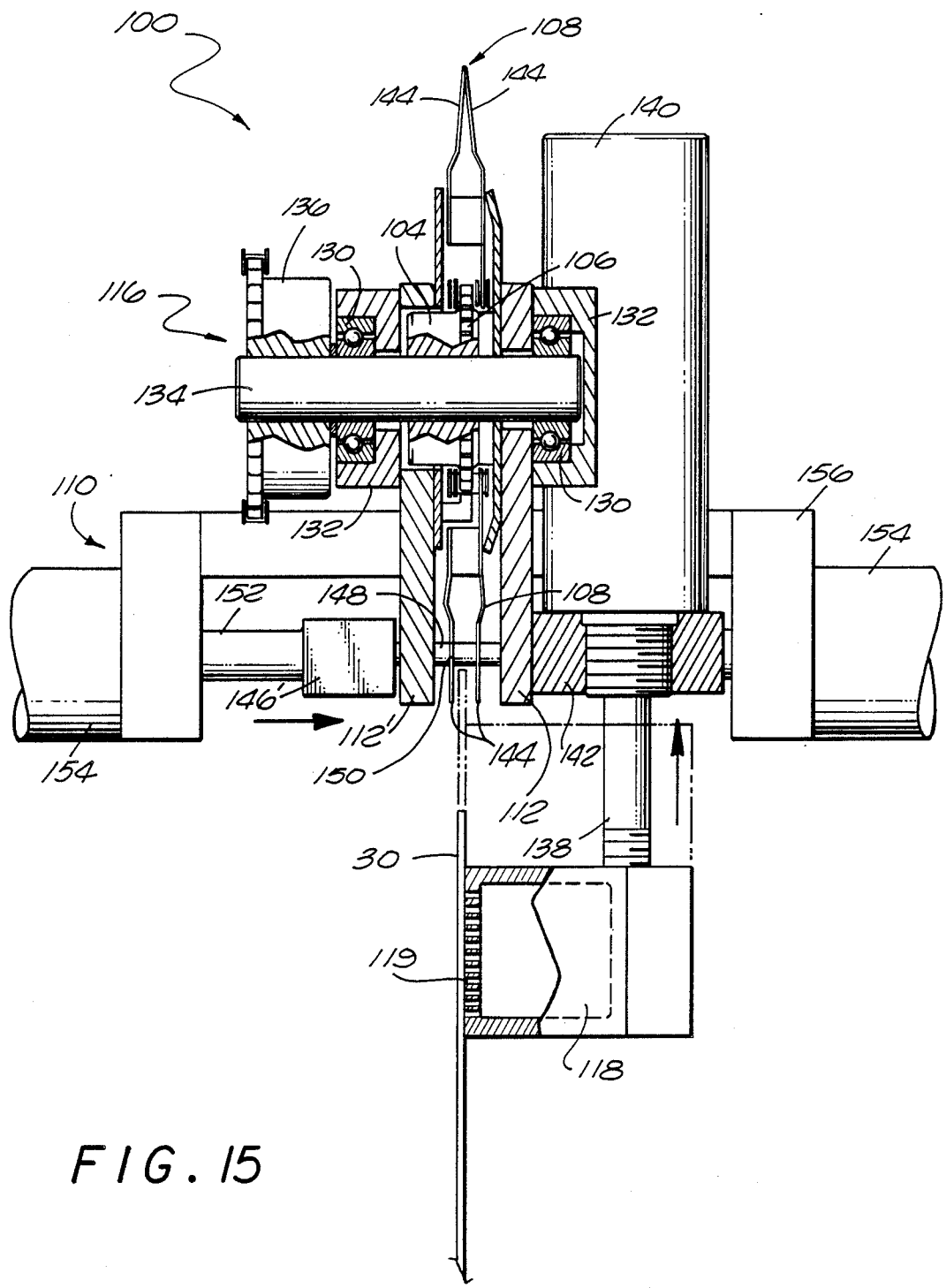
FIG. 15 is a cross sectional view of the invention taken along lines A—A of FIG. 5.

The precision operating characteristics of this invention will be appreciated upon reference to FIGS. 15 through 24 where further design features and operating characteristics are described. Referring to FIG. 15, a detailed cross section of the board transport mechanism 100 is shown. The sprocket assembly 116, which drives the clamp drive chain 106, utilizes design features that are time tested and known including dual bearings 130 and bearing housings 132, to provide a stable rotational point for the assembly shaft 134 that extends from the sprocket housing 136 through apertures to sequentially pass through the mounting plate 112, the transport bar 104, and the mounting plate 112'.

Again referring to FIG. 15, the vacuum clamp 118 is attached to the loading piston 138 of an air cylinder 140 that is mounted on a flange 142 and secured to mounting plate 112 having an aperture therein. Actuation of the air cylinder 140 causes the vacuum clamp to be raised and lowered. Referring additionally to FIG. 1, when boards 30 placed on the slotted platen 22 of the feed mechanism 20 are driven forward, they are sequentially brought into contact with an apertured surface 119 of the vacuum clamp 118 in its lowered position. Vacuum is created by a pump to secure the board 30 against the apertured surface 119. As the clamp 118 is raised, thereby dislodging a board 30 from the slotted platen 22, the pin bar mechanism 110, as described more particularly below, simultaneously causes the jaws 144 of the board clamp 108 to open. The board 30, dislodged from the slotted platform 22, is driven into the opened board clamp 108 and secured therein when the pin bar mechanism allows the clamps to close. The vacuum is released at that point.

Figure 16:
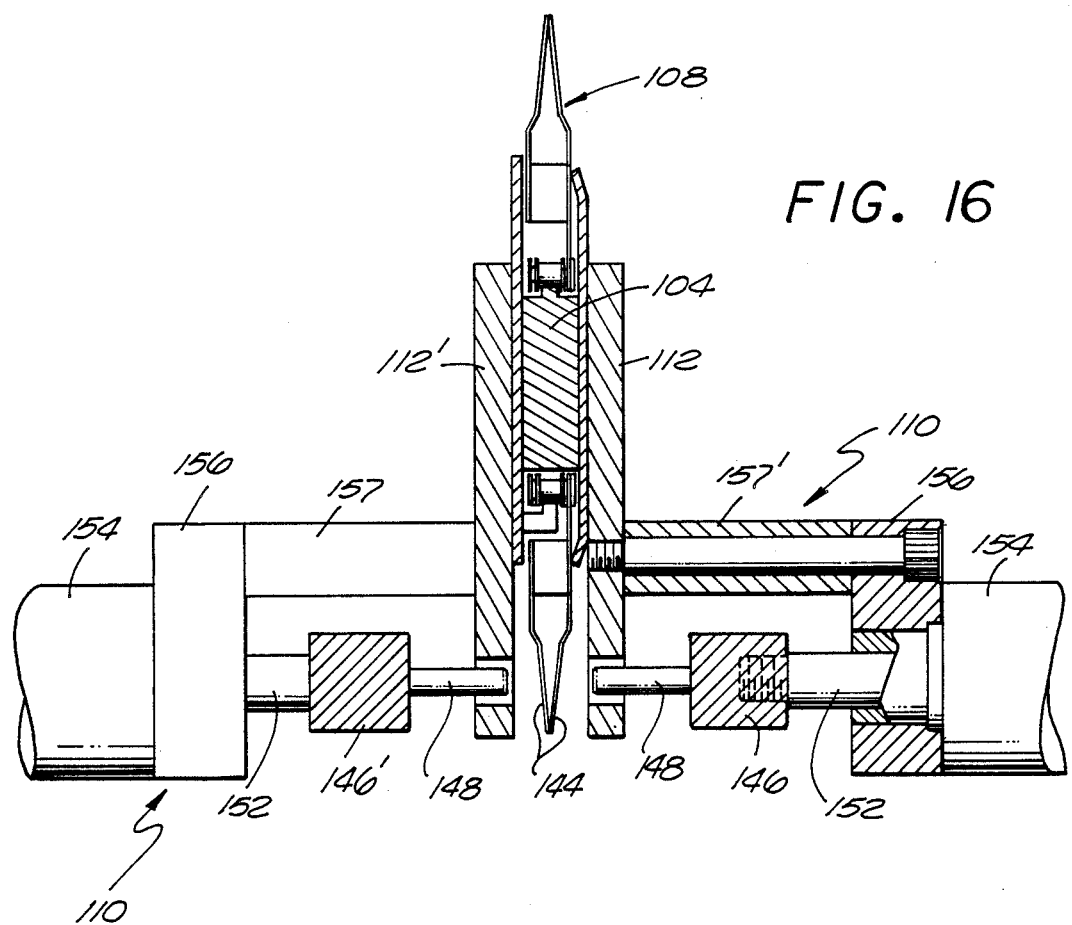
FIG. 16 is a cross sectional view of the invention taken along lines B—B of FIG. 5.
Figure 17:
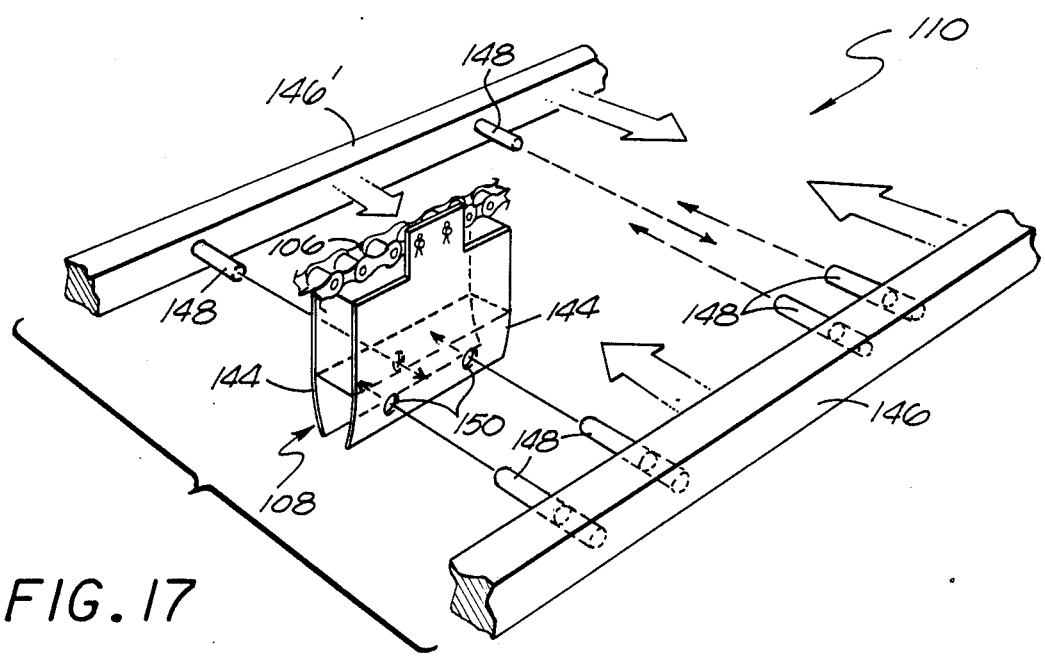
FIG. 17 is an exploded perspective view of the invention showing the pin bar mechanism.

Referring additionally to FIG. 16, the pin bar mechanism is formed from opposing bars 146, 146' having a plurality of pins 148 selectively spaced therein to penetrate apertures 150 in the jaws of the board clamps 108 as shown in FIG. 17. The bars are secured to a piston 152 extending from an air cylinder 154 mounted on cylinder mount brackets 156, 156' which are secured to the mounting plates 112, 112' through spacers 157, 157'. Actuation of the air cylinders 154 causes the pin bar mechanism 110 to drive three pins 148, one opposing two, to open each board clamp 108. The pins apply pressure against opposite inner surfaces of the clamp jaws 144 to pry the jaws apart as is shown in FIG. 15.

To further describe the design and operating characteristics of the squeegee vertical drive system element of this invention, attention is again directed to FIG. 7 where the flood blade and print squeegees are shown in perspective. As shown in FIG. 7, a flood blade 208 and print squeegee 210 are each mounted on an "L" shaped mounting plate 252. The mounting plate 252 is joined to a horizontal cross member 212 that has attachment flanges 250 on each end thereof. Referring also to FIG.

18, the flood blade 208 is joined to a shaft 254 of a cylinder 256 which extends through an aperture in the vertical leg 258 of the mounting plate 252.

A print squeegee 210 is disposed over the flood blade 208 on the same vertical mounting plate leg 258. The print squeegee 210 is pivotally attached to the shafts 262 of a pair of cylinders 260 mounted adjacent each end of the vertical mounting leg 258. The pivotal attachment is accomplished by a squeegee pivot assembly 270 formed of a bar 271 and clamp 273 which can be adjusted to accomplish a desired squeegee angle.

Figure 11:
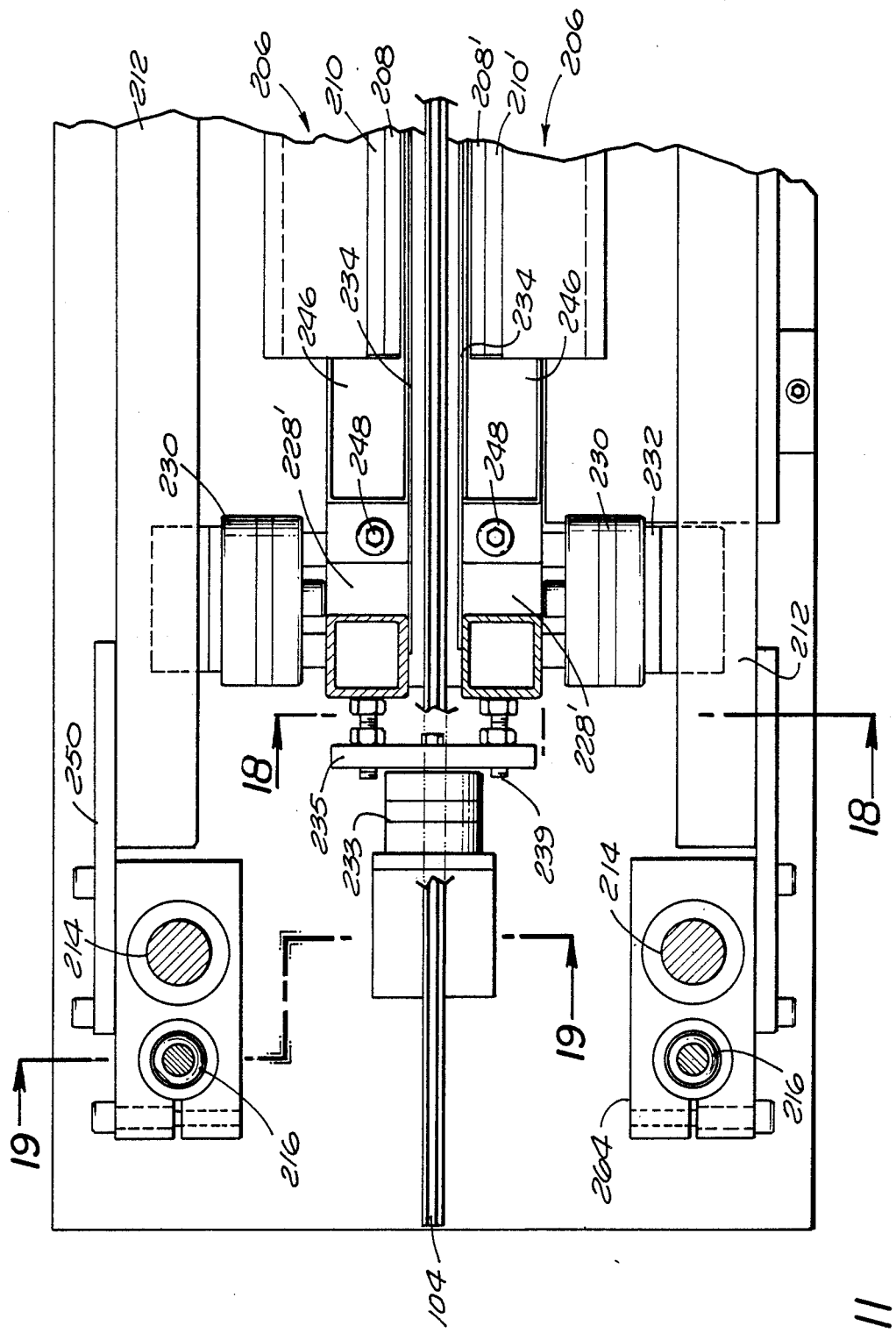
FIG. 11 is a partial plan view of the invention detailing the chase cylinder clamp system, and relationship of the cross members to the chase assembly.

Stop knobs 275 and 277 are provided to separately limit the horizontal movement of the flood blade and squeegee. Preferably stops are used on one chase while the squeegee on the other chase operates without stops (or with stops at the extreme, open-most positions). This enables the opposing squeegees to achieve and maintain parallel alignment. As shown in FIG. 11, the entire unit, which is slidably attached to a linear bearing assembly 214 via bearing blocks secured to a gusset 250 is driven in a vertical plane by the ball screw and nut system 216 (see FIG. 19).

Referring to FIG. 20, at the start of a print sequence, the squeegee vertical drive system 206 is at the bottom of the screen print assembly 200. The flood blades 208 are immersed in the ink 264 in the ink reservoir 246, and extended to the most proximate position with respect to the screen 234. As the sequence begins, the vertical drive system rises from the ink reservoir thereby spreading ink 264 onto the surface of the screen. The print squeegees 210 remain in their initial positions, away from the print screen. After the vertical drive system reaches the top of the area to be printed, the flood blades 208 are retracted, and the print squeegees 210 are extended so as to force the screens to contact the circuit board.

Figure 21:
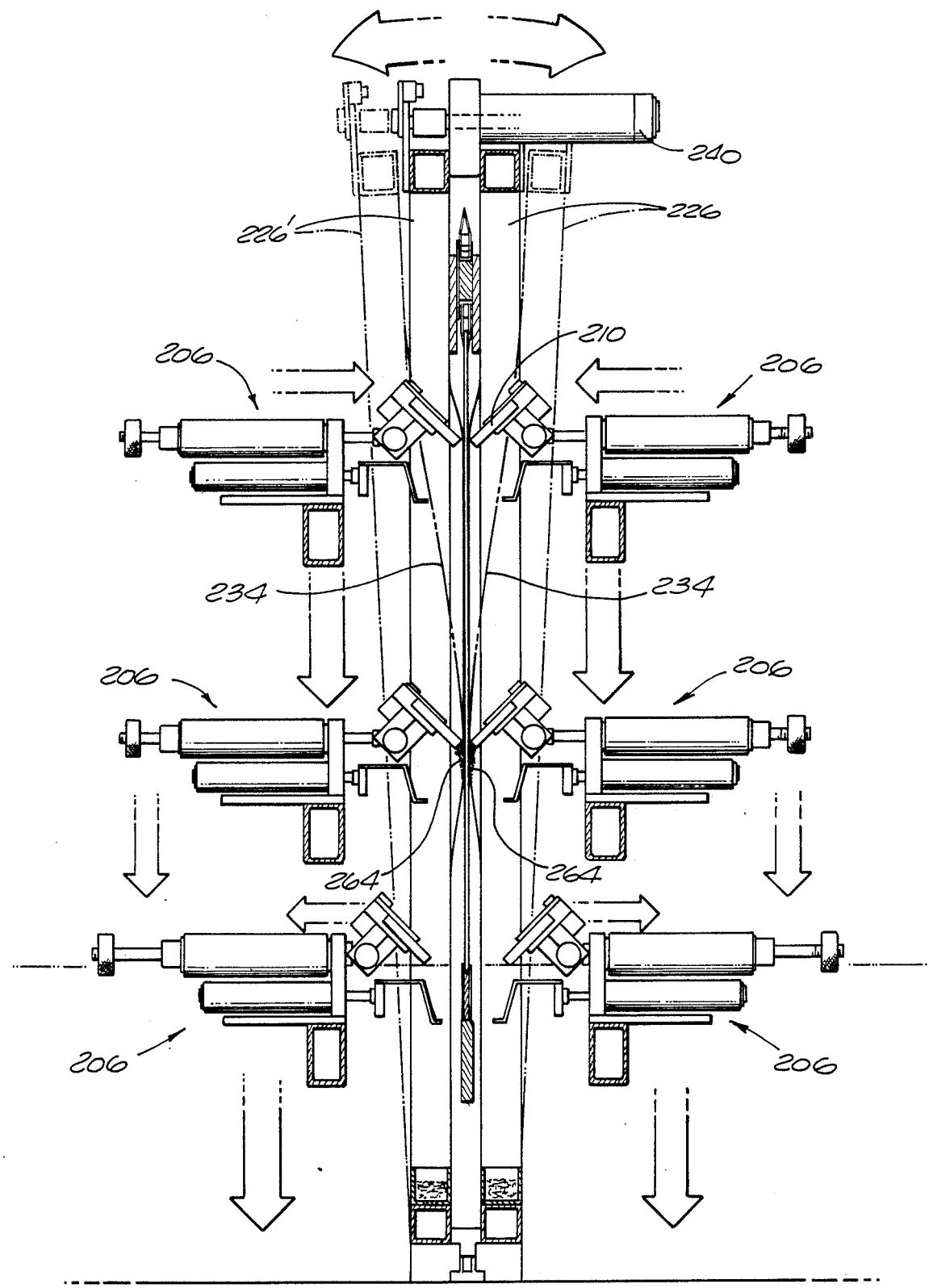
FIG. 21 is a schematic cross section of the invention showing the print stroke.

Referring to FIG. 21, at the start of the downward print stroke, the squeegee pivot assemblies 270 and print squeegees 210 are pushed toward the respective screens 234, impinging the rear surface of each screen onto the respective surface of the circuit board 30. As the drive system 206 descends, the squeegees 210 progressively sweep ink through the screens onto the surface of the board 30 except at the location of the holes in the board 30. Finally, at the bottom of the screens, the squeegees 210 and squeegee pivot assemblies 270 are retracted. At the same time, the chase pivot drive 240 is activated and operates as described with respect to FIGS. 12 through 14 to separate the chases.

Activation of the chase pivot drive 240 causes the chases 226, 226' to pivot about their respective bases and causes the screens to separate from the board. The chases are pivotally driven by the drive 240 formed from opposing cylinders that have been mounted on each side of the top support member 242 over apertures provided to permit the cylinder piston to extend through and contact flanges 236 provided along the respective chase tops 238. As the chases 226, 226' are separated, the inked screens are pulled away from the inked board 30. At this point, pneumatic pressure is applied to one or the other of the end cylinder clamps 233 (or bottom or top clamps if provided) to jog the chase about ¼ inch, alternatively right and left.

I claim:

1. A vertical screening apparatus for simultaneously screening each side of a printed circuit board with inking material, comprising:

a screen print assembly comprising two vertically oriented chases pivotally mounted about their bases in opposing spacial parallel relationship with respect to each other;

a squeegee vertical drive system that reciprocates through a vertical plane on opposite sides of the chases, consisting of opposing flood blades and print squeegees adapted for sequentially contacting and compressing print screens disposed within each of said chases; and a board transport mechanism synchronously integrated with said screen print assembly, above and extending from a feed platen assembly to an output platen assembly comprising means for sequentially moving said board into and out of a print zone within said screen print assembly.

2. The apparatus of claim 1 including an ink reservoir disposed along the base of each of said chases, for retaining inking material.

3. The apparatus of claim 1, adapted to sequentially print a plurality of circuit boards, in which said feed platen assembly is formed with a plurality of slots for said plurality of circuit boards, wherein said circuit boards are sequentially carried by and lifted from said feed platen assembly.

4. The apparatus of claim 3 in which said output platen assembly is formed with a plurality of slots for said plurality of circuit boards.

5. The apparatus of claim 1 adapted to sequentially print a plurality of circuit boards in which said feed platen assembly comprises means for vertically disposing said circuit boards and means for moving said circuit boards whereby to align an outer circuit board with said print zone, and transport means for carrying said aligned board into and out of said print zone.

6. The apparatus of claim 5 in which said transport means comprises a vacuum clamp at the feed end of said print zone for vacuum engaging a leading surface of said outer circuit board.

7. The apparatus of claim 5 in which said transport means comprises an elongate transport bar disposed along said print zone and carrying mechanical clamps movable with respect to said bar, means for rotating said clamps about the longitudinal periphery of said bar, and means for opening said mechanical clamps and closing said mechanical clamps about an edge of a circuit board.

8. The apparatus of claim 1 in which said vertical drive system comprises a base having four corners, a rotatable elongate screw mounted on each of the four corners of said base, said screws being coupled to said squeegee vertical drive system whereby rotation of two of said screws on one side of said base serve to raise and lower the squeegee on that side whereas the screws on the other side of said base serve to lower the squeegee on said other side, and means for simultaneous rotation of said screw.

9. The apparatus of claim 8 in which said means for simultaneously rotating said screws comprises a single chain connected to each of said screws and driven by at least one drive motor.

10. The apparatus of claim 1 including means for shifting said chases along the plane of said print zone.

11. The apparatus of claim 1 including means for limiting the rearward movement of one only of said squeegees, the other of said squeegees being free to pivot against said limited squeegee whereby to achieve and maintain parallel alignment of said squeegees during reciprocation of said squeegees through said vertical plane.

12. The apparatus of claim 1 including pneumatic clamping means on the bottom edges of said chases, and a single securement point at the top of each chase whereby to facilitate rapid release of said chases.

13. The apparatus of claim 1 including a feed platen system integrally connected to said board transport system wherein said circuit boards are carried by and lifted from said feed platen system.

14. A vertical screening apparatus for simultaneously screening each side of a printed circuit board with inking material, comprising:

a board transport mechanism synchronously integrated with a vertical screen print assembly and superimposed above and extending from a feed platen assembly to an output platen assembly, comprising an elongated transport bar having a motor driven chain rotatably disposed about the longitudinal periphery of said bar with mechanical clamps disposed thereon, a vacuum clamp affixed at one end thereof, and a pin bar mechanism for opening said mechanical clamps to receive circuit boards lifted for engagement therein by said vacuum clamp for sequential movement of said board into and out of a print zone within said screen print assembly;

said screen print assembly comprising two vertically orientated chases pivotally mounted about their bases in opposing spatial parallel relationship with respect to each other, a squeegee vertical drive system that reciprocates through a vertical plane on opposing sides of the chases, consisting of opposing flood blades and print squeegees adapted for sequentially contacting and compressing print screens disposed within each of said chases, and ink reservoirs for retaining inking material disposed along the base of said chases.

* * * * *